(12) United States Patent
Hartjes et al.

(10) Patent No.: US 12,339,587 B2
(45) Date of Patent: Jun. 24, 2025

(54) FACET ASSEMBLY FOR A FACET MIRROR

(71) Applicant: Carl Zeiss SMT GmbH, Oberkochen (DE)

(72) Inventors: Joachim Hartjes, Aalen (DE); Alexander Wolf, Essingen (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 245 days.

(21) Appl. No.: 17/960,414

(22) Filed: Oct. 5, 2022

(65) Prior Publication Data

US 2023/0026528 A1 Jan. 26, 2023

Related U.S. Application Data

(63) Continuation of application No. PCT/EP2021/060036, filed on Apr. 19, 2021.

(30) Foreign Application Priority Data

Apr. 23, 2020 (DE) .......................... 102020205123.2

(51) Int. Cl.
*G03F 7/00* (2006.01)
*G02B 5/09* (2006.01)
(Continued)

(52) U.S. Cl.
CPC ........... *G03F 7/70075* (2013.01); *G02B 5/09* (2013.01); *G02B 7/1815* (2013.01); *G02B 26/0825* (2013.01); *G03F 7/7015* (2013.01)

(58) Field of Classification Search
CPC .... G02B 26/0825; G02B 5/0891; G02B 5/09; G02B 7/1815; G03F 7/70075;
(Continued)

(56) References Cited

U.S. PATENT DOCUMENTS 6,859,515 B2    2/2005    Schultz et al.
8,817,233 B2    8/2014    Mann
(Continued)

FOREIGN PATENT DOCUMENTS

CN          109 804 313 A    5/2019
DE    10 2008 049 586 A1    4/2010
(Continued)

OTHER PUBLICATIONS

International Search Report and Written Opinion for corresponding PCT Appl No. PCT/EP2021/060036, dated Jul. 20, 2021.
(Continued)

*Primary Examiner* — Deoram Persaud
(74) *Attorney, Agent, or Firm* — Fish & Richardson P.C.

(57) ABSTRACT

A facet assembly is a constituent part of a facet mirror for an illumination optical unit for projection lithography. The facet assembly has a facet with a reflection surface for reflecting illumination light. A facet main body of the facet assembly has at least one hollow chamber. A reflection surface chamber wall of the hollow chamber forms at least one portion of the reflection surface. An actuator control apparatus of the facet assembly is operatively connected to the hollow chamber for the controlled deformation of the reflection surface chamber wall. The result is a facet assembly that is usable flexibly as a constituent part of a facet mirror equipped therewith within an illumination optical unit for projection lithography.

21 Claims, 5 Drawing Sheets

(51) Int. Cl.
  *G02B 7/18* (2021.01)
  *G02B 26/08* (2006.01)
(58) Field of Classification Search
  CPC ............ G03F 7/70116; G03F 7/70141; G03F
       7/7015; G03F 7/70266; G05B 15/02;
       G05B 2219/2642; G10L 13/08; G10L
       15/22; H04L 67/12; H04L 9/40; G16Y
       10/80; G16Y 20/20; G16Y 20/40; G16Y
       40/10; G16Y 40/35
  See application file for complete search history.

(56) References Cited

U.S. PATENT DOCUMENTS

| | | | |
|---|---|---|---|
| 2002/0011573 A1 | 1/2002 | Van Dijsseldonk et al. | |
| 2011/0001947 A1 | 1/2011 | Dinger et al. | |
| 2013/0128252 A1* | 5/2013 | Rassel | G02B 5/0891 |
| | | | 359/850 |
| 2016/0342094 A1* | 11/2016 | Endres | G02B 19/0019 |
| 2017/0276842 A1* | 9/2017 | Sarov | G03F 7/70116 |
| 2018/0188656 A1* | 7/2018 | Bihr | G02B 26/0841 |
| 2022/0181210 A1* | 6/2022 | Kamikawa | H01L 21/7806 |
| 2023/0205099 A1* | 6/2023 | Lippoldt | G03F 7/70266 |
| | | | 355/67 |
| 2024/0012334 A1* | 1/2024 | Raab | G02B 5/09 |

FOREIGN PATENT DOCUMENTS

| | | |
|---|---|---|
| DE | 10 2012 212 953 A1 | 6/2013 |
| DE | 10 2013 206 981 A1 | 12/2013 |
| DE | 10 2015 200 531 A1 | 2/2016 |
| DE | 10 2016 209 847 A1 | 7/2016 |
| DE | 10 2017 221 420 A1 | 11/2018 |
| EP | 1 225 481 A2 | 7/2002 |
| EP | 1 376 192 A2 | 1/2004 |
| TW | I574302 | 3/2017 |

OTHER PUBLICATIONS

German Office Action, with translation thereof, for corresponding DE Appl No. 10 2020 205 123.2, dated Oct. 22, 2020.
Taiwan Office Action and Search Report, with translation thereof, for corresponding TW Appl No. 110106144, dated Aug. 2, 2022.

* cited by examiner

FACET ASSEMBLY FOR A FACET MIRROR

CROSS-SECTION TO RELATED APPLICATIONS

The present application is a continuation of, and claims benefit under 35 USC 120 to, international application PCT/EP2021/060036, filed Apr. 19, 2021, which claims benefit under 35 USC 119 of German Application No. 10 2020 205 123.2, filed Apr. 23, 2020. The entire disclosure of these applications are incorporated by reference herein.

FIELD

The disclosure relates to a facet assembly for a facet mirror for an illumination optical unit for projection lithography. The disclosure furthermore relates to a facet mirror having such a facet assembly, to an illumination optical unit having such a facet mirror, to an optical system having such an illumination optical unit, to such an illumination optical unit or such an optical system having a light source, to a projection lithography apparatus having such an optical system, to a method for producing a microstructured or nanostructured component with such a projection exposure apparatus and to a structured component that has been produced in this manner.

BACKGROUND

An illumination optical unit for EUV projection lithography is known from DE 10 2015 200 531 A1, from US 2011/0001947 A1 and from U.S. Pat. No. 8,817,233 B2. Field facets that can be constituent parts of a field facet mirror are known from DE 10 2013 206 981 A1 and DE 10 2017 221 420 A1.

SUMMARY

The present disclosure seeks to create a facet assembly that is usable flexibly as a constituent part of a facet mirror equipped therewith within an illumination optical unit for projection lithography.

It has been found according to the disclosure that embodying the facet main body with at least one hollow chamber, wherein a reflection surface chamber wall of the hollow chamber forms at least one reflection surface portion, can decrease a stiffness of the reflection surface of the facet of the facet assembly. This could be considered surprising because, for example, a decrease in stiffness in the starting point appears counter-productive with regard to achieving a high illumination light guidance precision. The decreased stiffness of the hollow chamber embodiment according to the disclosure can be used for the targeted deformation of the reflection surface of the facet. The facet assembly can be used as a constituent part of a field facet mirror of an EUV projection exposure apparatus. At least one actuator for the deformation of the reflection surface chamber wall can be part of the actuator control apparatus.

The facet main body can be divided into a plurality of hollow chambers, wherein reflection surface chamber walls form different reflection surface portions. This can increase the flexibility of the assembly with respect to achieving a specified target deformation of the reflection surface. The target deformation can then be achieved with greater precision.

In some embodiments, the actuator control apparatus is signal-connected to a plurality of actuator units that are assigned in each case to the hollow chambers and/or to the reflection surface chamber walls of the reflection surface portions. Such embodiments can allow independent control of different reflection surface portions, for example of the reflection surface portions that, in the case of an embodiment with a plurality of hollow chambers, are assigned to different hollow chambers.

In some embodiments, an arrangement of the hollow chambers is such that the reflection surface portions formed by the reflection surface chamber walls of the hollow chambers are arranged in the form of exactly one reflection surface row (i=1) or in the form of exactly one reflection surface column (j=1) or in the form of a reflection surface array (i>1, j>1) with at least two reflection surface rows (j>1) and with at least two reflection surface columns (i>1). In such embodiments, the arrangement of the hollow chambers permits deformation control adapted to expected deformations for the adaptation of a reflection surface shape to desired target shapes. A division into rows according allows, for example, a variation of a curvature of the reflection surface in a first curvature plane. Similar is true for the second variant regarding a second curvature plane, in which the curvature can be varied. A reflection surface array allows deformation adaptation in two dimensions over the reflection surface. A division into an array can be effected in the form of a Cartesian array, for example in the form of a regular grid in x and y. Other ways of covering the reflection surface with reflection surface portions that are each assigned to a hollow chamber are also possible, for example coverings that are adapted, in terms of the symmetric distribution thereof, to the symmetries of a desired deformation. A covering in the form of known, gap-free tessellation is likewise possible.

In some embodiments, a number of the reflection surface portions that are assigned in each case one hollow chamber along a reflection surface row differs from the number of the reflection surface portions that are assigned in each case one hollow chamber along a reflection surface column. In such embodiments, the number of the reflection surface portions that are assigned in each case one hollow chamber along a reflection surface row differ from the number of the reflection surface portions that are assigned in each case one hollow chamber along a reflection surface column. The reflection surface portions can be arranged in the form of a reflection surface array.

The number of the reflection surface portions that are assigned in each case one hollow chamber along a reflection surface row can lie in the range between 1 and 100. The corresponding number of reflection surface portions that are assigned in each case one hollow chamber along a reflection surface column can lie in the range between 1 and 10.

The reflection surface of the facet can have a basic area with an x/y aspect ratio that is not equal to 1 and can be greater than 5. A number of the reflection surface portions that are assigned in each case one hollow chamber can be greater in the x-direction than in the y-direction. This can be desirable, for example, when the facet assembly is used as a constituent part of a field facet mirror with which an object field having an x/y aspect ratio that is not equal to 1 and is for example greater than 5 is fully illuminated.

The actuator control apparatus can be connected to the at least one reflection surface chamber wall via at least one actuator or via at least one actuator unit. This connection can be a mechanical connection. The mechanical connection can be implemented in the form of a spring.

In some embodiments, the actuator control apparatus is operatively connected to the reflection surface via at least one additional fine adjustment actuator unit. In such embodiments, the additional fine adjustment actuator unit can likewise be implemented in the form of a mechanical connection to the reflection surface. Alternatively or additionally, the fine adjustment actuator unit can interact with a piezo coating of the reflection surface. A corresponding piezo coating can be implemented in the form of a piezo stack coating. The fine adjustment actuator unit can be used to set for example a deformation that is ten times more accurate than with the other actuator units.

The following may be used as an actuator unit or as a fine adjustment actuator unit:
 piezo actuators,
 magnetostrictive actuators,
 electrostatic actuators,
 thermal actuators, in the case of which the coefficient of thermal expansion is used and which are brought to a specified temperature; thermal energy can be introduced here by heating or cooling, for example via resistance heating systems or Peltier elements,
 electromagnetic actuators.

Piezo actuators, which may also be present in the form of piezo layers/piezo stacks, which can be used as actuator units in principle, are described in DE 10 2016 209 847 A1.

In some embodiments, the at least one hollow chamber that forms at least one portion of the reflection surface over a reflection surface chamber wall or at least one further hollow chamber of the facet assembly is filled with a medium. In such embodiments, the medium can serve for various purposes. For example, the medium can serve for removing heat from the reflection surface to the facet main body and possibly to a heat sink or heat trap. A filling medium that can be used is liquid metal, for example Galinstan. Alternatively, the filling medium that can be used is a heat-conducting paste, a ceramic dispersion, a powder or a granular material. A thermal conductivity of the medium can be greater than 7 W/mK and can be, for example, at least 10 W/mK.

The at least one hollow chamber can alternatively or additionally be filled with a fluid, with a gas and/or with a liquid.

In some embodiments, the at least one hollow chamber or a further hollow chamber is filled with a fluid, wherein the actuator control apparatus is operatively connected to the hollow chamber for changing a fluid pressure in the hollow chamber in a controlled manner. In such embodiments, a fine deformation specification is obtained via the controllable pressure change. In addition to a hydraulic specification of the pressure change, it is also possible to bring about a density variation of the fluid by applying a corresponding electric field or by introducing magnetic forces depending on the type of the fluid used. A corresponding change in pressure or density variation can be effected via individual actuator units that are assigned to the reflection surface portions, which are in turn assigned to the different hollow chambers.

In some embodiments, the disclosure provides a facet mirror having a facet assembly described herein. In some embodiments, at least some of the facets of the facet assembly are tiltable between a plurality of tilt positions for changing a deflecting effect for the illumination light. In such embodiments, the reflection surface deformation of the facet assembly that is specifiable via the actuator control apparatus can be made dependent on the tilt position of the facet. This allows adaptation of the reflection surface shape of the respective facets on the basis of the assignment of the facet to an illumination channel of an illumination optical unit, of which the facet mirror is a part.

Features of a related illumination optical unit, a related optical system, a related optical system, a related projection exposure apparatus, a related production method, a related microstructured or nanostructured component correspond to those which have already been discussed above with reference to the facet assembly according to the disclosure and the facet mirror according to the disclosure.

The illumination optical unit or the optical system can realize a degree of pupil filling (percentage of illuminated portions of a pupil of a total area of pupil used) of less than 30%, of less than 25%, of less than 20% and, for example, of less than 15%.

The light source can be an EUV light source. The light source can be a laser plasma source. The light source can have an illumination light used power of more than 500 W and also of more than 800 W.

For example, a semiconductor component, for example a memory chip or a chip for processing data, can be produced using the projection exposure apparatus.

BRIEF DESCRIPTION OF THE DRAWINGS

Exemplary embodiments of the disclosure are explained in greater detail below with reference to the drawing. In the drawings.

EXEMPLARY EMBODIMENTS

Figure 1:
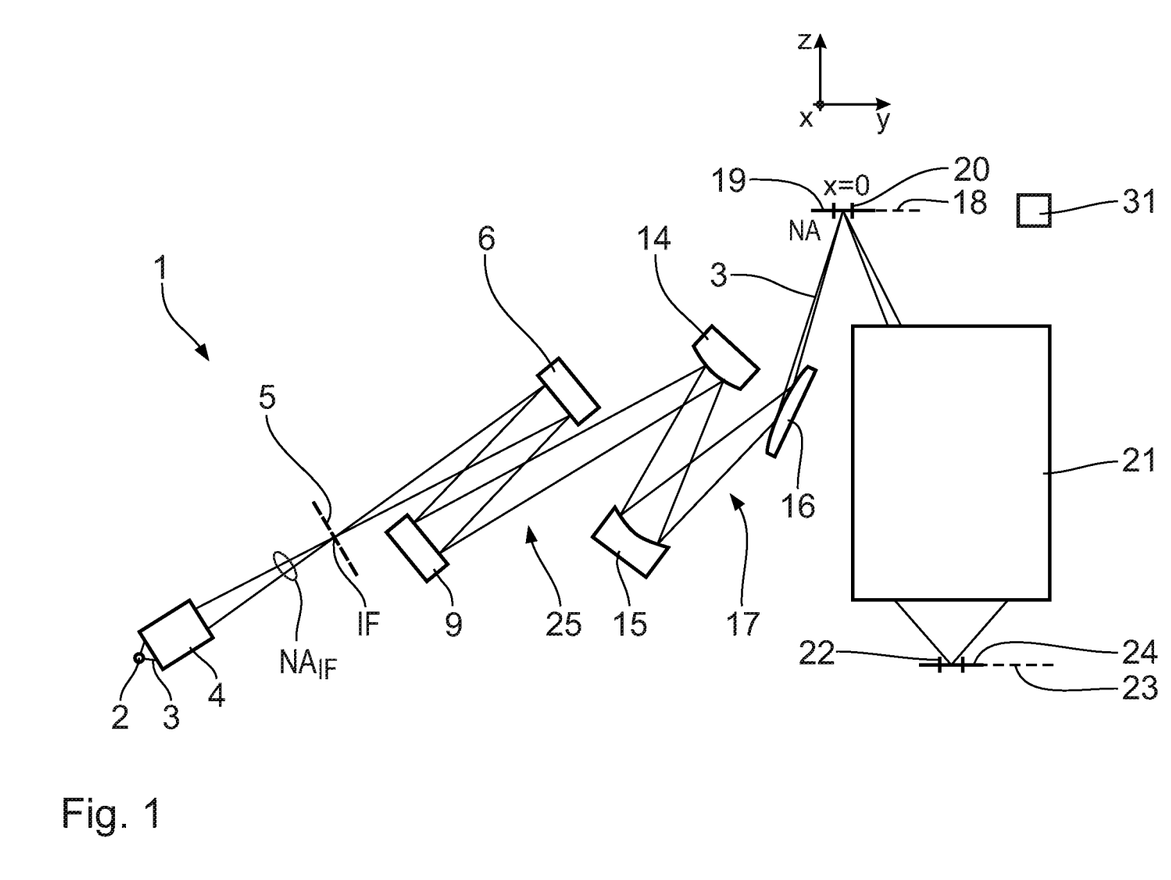
FIG. 1 shows a microlithographic projection exposure apparatus schematically and with respect to an illumination optical unit in a meridional section.

A microlithographic projection exposure apparatus 1 serves for producing a microstructured or nanostructured electronic semiconductor component. A light source 2 emits EUV radiation used for illumination in the wavelength range of, for example, between 5 nm and 30 nm. The light source 2 can be a GDPP (gas discharge produced plasma) source or an LPP (laser produced plasma) source. A radiation source based on a synchrotron can also be used for the light source 2. Information about such a light source can be found by a person skilled in the art in U.S. Pat. No. 6,859,515 B2, for example. EUV illumination light or illumination radiation 3 is used for illumination and imaging within the projection exposure apparatus 1. The EUV illumination light 3 downstream of the light source 2 firstly passes through a collector 4, which can be, for example, a nested collector having a multi-shell construction known from the prior art, or alternatively an ellipsoidally shaped collector. A corresponding collector is known from EP 1 225 481 A2. Downstream of the collector 4, the EUV illumination light 3 firstly passes through an intermediate focus IF in an intermediate focal plane 5, which can be used for separating the EUV illumination light 3 from unwanted radiation or particle portions. After passing through the intermediate focal plane 5, the EUV illumination light 3 is first incident on a field facet mirror 6. An overall beam of the illumination light 3 has a numerical aperture NAT in the intermediate focal plane 5.

In general, light with a longer wavelength, e.g., DUV light with a wavelength of 193 nm, can also be used as the illumination light 3.

In order to facilitate the description of positional relationships, a Cartesian global xyz-coordinate system is in each case depicted in the drawing. In FIG. 1, the x-axis extends perpendicularly to the plane of the drawing and out of the latter. The y-axis extends toward the right in FIG. 1. The z-axis extends toward the top in FIG. 1.

In order to facilitate the description of positional relationships for individual optical components of the projection exposure apparatus 1, a Cartesian local xyz- or xy-coordinate system is in each case also used in the following figures. The respective local xy-coordinates span, unless described otherwise, a respective principal arrangement plane of the optical component, for example a reflection plane. The x-axes of the global xyz-coordinate system and of the local xyz- or xy-coordinate systems run parallel to one another. The respective y-axes of the local xyz- or xy-coordinate systems are at an angle with respect to the y-axis of the global xyz-coordinate system which corresponds to a tilting angle of the respective optical component about the x-axis.

Figure 2:
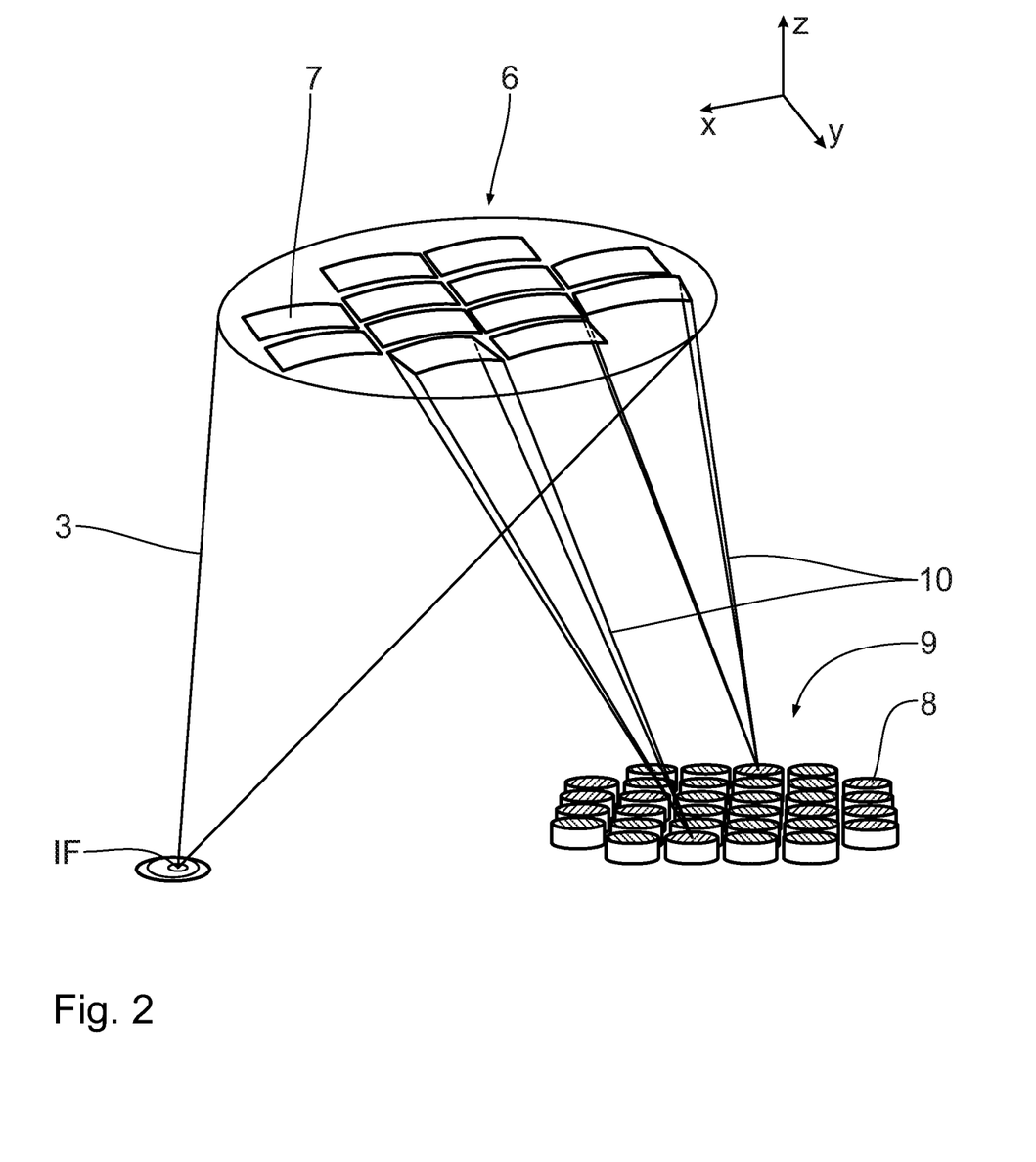
FIG. 2 shows a guidance of illumination light in the illumination optical unit of FIG. 1 between an intermediate focus and a pupil facet mirror perspectively and somewhat less schematically, wherein marginal rays of two illumination channels between a field facet mirror and the pupil facet mirror are emphasized.

FIG. 2 shows a guidance of the illumination light 3 between the intermediate focus IF via reflective field facets 7 of the field facet mirror 6 to pupil facets 8 of a pupil facet mirror 9 that is arranged downstream in the beam path of the illumination light 3. Illumination channels 10 of the beam guidance are specified by a respective one of the field facets 7 of the field facet mirror 6 and by a respective pupil facet 8 of the pupil facet mirror 9. Two of the illumination channels 10 are emphasized in FIG. 2 in an exemplary manner.

As is indicated in FIG. 2, the field facets 7 can have a bent basic shape or a basic shape of part of a circle, which is adapted to a boundary shape of an object field of the projection exposure apparatus 1 that will be explained below. Alternatively, the field facets 7 can also have a rectangular basic shape, as is illustrated in FIG. 3.

The field facets 7 can be plane mirrors. Alternatively, the field facets 7 can have concavely curved (cf. FIG. 2) or convexly curved reflection surfaces.

The field facets 7 are rectangular and have in each case the same x/y aspect ratio. The x/y aspect ratio can be for example 12/5, can be 25/4 or can be 104/8. The x/y aspect ratio is not equal to 1 and can be greater than 5.

Figure 3:
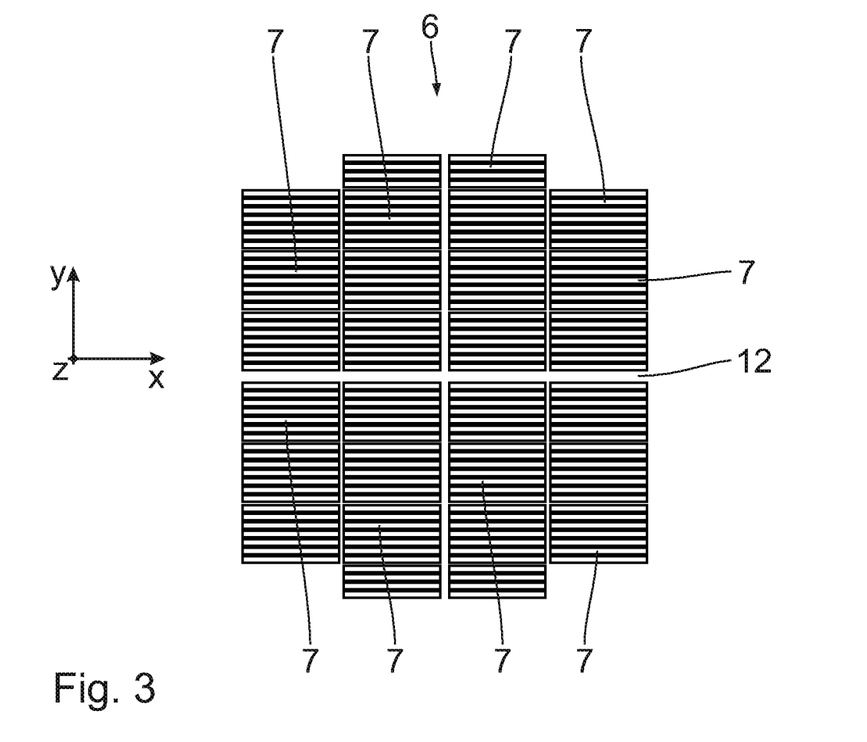
FIG. 3 shows a plan view of a facet arrangement of a further embodiment of a field facet mirror of the illumination optical unit of the projection exposure apparatus according to FIG. 1.

The field facets 7 of the facet arrangement of FIG. 3 are arranged in four columns. The field facet arrangement of the field facet mirror 6 has interstices 12, in which the field facet mirror 6 can be shadowed by holding spokes of the collector 4, between the two central facet columns and halfway up the facet arrangement in the y-dimension.

After reflection at the field facet mirror 6, the EUV illumination light 3 that has been split into pencils of rays or partial beams assigned to the individual illumination channels 10 is incident on the pupil facet mirror 9. The field facets 7 of the field facet mirror 6 are tiltable between a plurality of illumination tilt positions, and so this alters the direction of a beam path of the illumination light 3 reflected by the respective field facet 7 and hence is able to alter the point of incidence of the reflected illumination light 3 on the pupil facet mirror 9.

The pupil facets 8 of the pupil facet mirror 9 can be arranged in rows and columns or hexagonally or such that they lie adjacent to one another in another way. At least one of the pupil facets 8 is assigned to each partial beam of the EUV illumination light 3 reflected by one of the field facets 7, that is to say to each illumination channel 10, in such a way that a respective impinged pair with one of the field facets 7 and one of the pupil facets 8 prescribes the illumination channel 10 for the associated partial beam of the EUV illumination light 3. The channel-by-channel assignment of the pupil facets 8 to the field facets 7 is implemented on the basis of a desired illumination by the projection exposure apparatus 1, which is also referred to as illumination setting.

The field facet mirror 6 has several hundred of the field facets 7, for example 300 field facets 7. A number of the pupil facets of the pupil facet mirror 9 can at least equal the sum of the tilt positions of all field facets 7 of the field facet mirror 6.

In a variant not illustrated, the pupil facet mirror 9 is constructed as a MEMS mirror array with a multiplicity of tiltable individual mirrors, with each of the pupil facets 8 being formed by a plurality of such individual mirrors. Such a construction of the pupil facet mirror 9 is known from US 2011/0001947 A1.

Via the pupil facet mirror 9 (cf. FIG. 1) and a downstream transfer optical unit 17 consisting of three EUV mirrors 14, 15, 16, the field facets 7 are imaged into an object plane 18 of the projection exposure apparatus 1 so as to superpose one another. The EUV mirror 16 is embodied as a mirror for grazing incidence (grazing incidence mirror). Arranged in the object plane 18 is an object in the form of a reticle 19, of which, with the EUV illumination light 3, an illumination region in the form of an illumination field is illuminated, which illumination field coincides with an object field 20 of a downstream projection optical unit 21 of the projection exposure apparatus 1. The object field illumination channels are superimposed in the object field 20. The EUV illumination light 3 is reflected by the reticle 19.

As has already been mentioned above, the field facets 7 can each have a rectangular outer contour, as is illustrated in FIG. 3, or can have a curved, arcuate outer contour that can be adapted to a corresponding curvature of an outer contour of the object field 20.

An overall beam of the illumination light 3 at the object field 20 has an object-side numerical aperture NA, which may lie in the range between 0.04 and 0.15, for example.

The projection optical unit 21 images the object field 20 in the object plane 18 into an image field 22 in an image plane 23. Arranged in the image plane 23 is a wafer 24 carrying a light-sensitive layer, which is exposed during the projection exposure via the projection exposure apparatus 1. During the projection exposure, both the reticle 19 and the wafer 24, which are carried by respective holders, are scanned in a synchronized manner in the y-direction. The projection exposure apparatus 1 is embodied as a scanner. Below, the scanning direction y is also referred to as object displacement direction.

The field facet mirror 6, the pupil facet mirror 9 and the mirrors 14 to 16 of the transfer optical unit 17 are constituent parts of an illumination optical unit 25 of the projection exposure apparatus 1. In a variant of the illumination optical unit 25, which is not illustrated in FIG. 1, the transfer optical unit 17 may also be dispensed with in part or in full, and so no further EUV mirror, exactly one further EUV mirror or exactly two further EUV mirrors may be arranged between the pupil facet mirror 9 and the object field 20. The pupil facet mirror 9 can be arranged in an entry pupil plane of the projection optical unit 21.

Together with the projection optical unit 21, the illumination optical unit 25 forms an optical system of the projection exposure apparatus 1.

Figure 4:
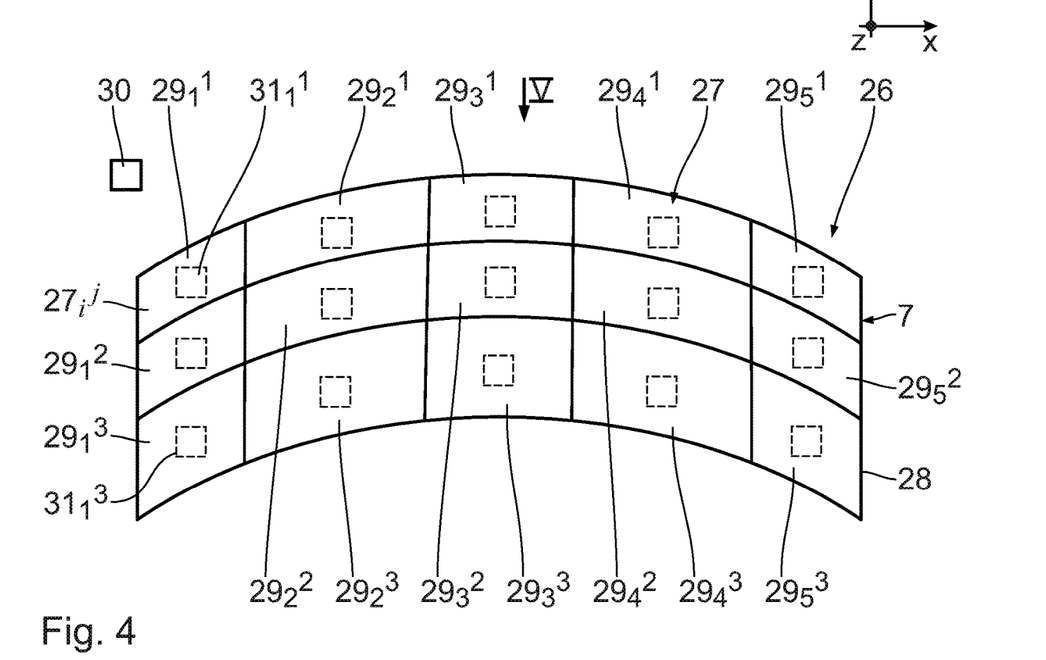
FIG. 4 shows a plan view of a facet assembly with a facet of the field facet mirror of FIG. 2, which serves for guiding an illumination channel, wherein a reflection surface for guiding the illumination light is facing the observer.

FIG. 4 shows a plan view of a facet assembly 26 with one of the field facets 7. A reflection surface 27 of the field facet 7 that serves for reflecting the illumination light 3 is facing the observer of FIG. 4. The reflection surface 27 can carry a multilayer coating made up of alternating layers, for example of molybdenum and silicon, for producing a high reflectivity for the EUV illumination light 3. In terms of a force-free basic shape, the reflection surface 27 can be a toric surface and/or a freeform surface, that is to say a surface without a plane of symmetry or an axis of symmetry.

Figure 5:
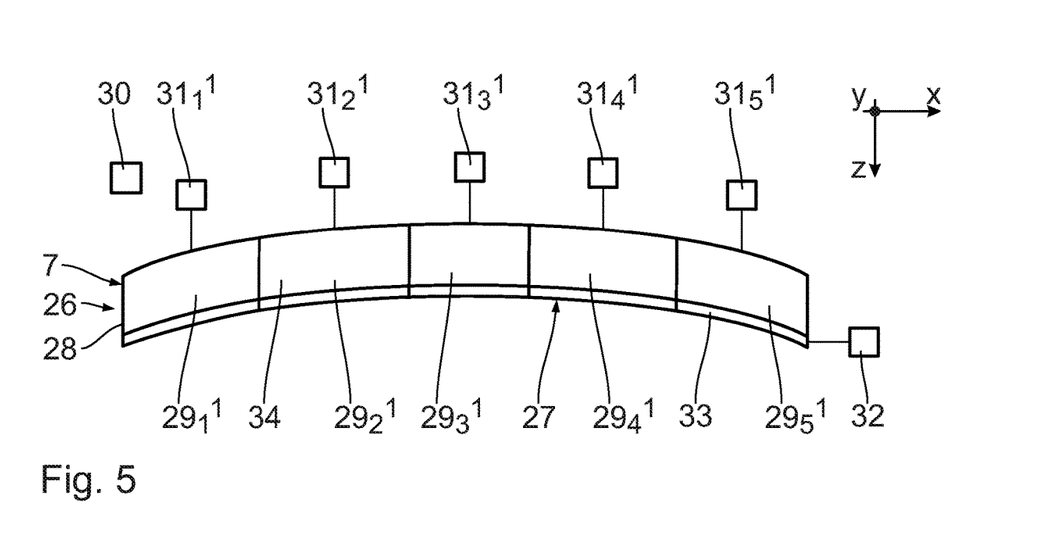
FIG. 5 shows a side view of the facet assembly, viewed from the viewing direction V of FIG. 4.

FIG. 5 shows a side view of the facet assembly 26 with the field facet 7.

A facet main body 28 of the facet 7 is divided into a plurality of hollow chambers $29_i^j$. This arrangement of the hollow chambers $29_i^j$ is such that a reflection surface chamber wall of the respective hollow chamber $29_i^j$ forms portions $27_i^j$ of the reflection surface 27 in the form of a reflection surface array with three reflection surface rows (j=1 to 3) and with five reflection surface columns (i=1 to 5). This array-type arrangement of the reflection portions $27_i^j$ is illustrated in the top view of FIG. 4, wherein each of the hollow chambers $29_i^j$ is assigned one reflection portion $27_i^j$. Overall, the field facet 7 of the facet assembly 26 thus has 15 reflection portions $27_1^1$ to $27_5^3$ and assigned hollow chambers $29_1^1$ to $29_5^3$.

In the embodiment illustrated, the number of the reflection surface portions $27_i^j$ along a reflection surface row, specifically i=5, differs from the number of reflection surface portions $27_i^j$ along a reflection surface column, specifically j=3. The number of the reflection surface portions along a row, the number along the x-direction, can be greater than the number of the reflection surface portions along a column, that is to say along the y-direction.

The number of the reflection surface rows j can lie in the range between 1 and 100, for example, between 1 and 50, such as between 1 and 10. The number of the reflection surface columns i can lie in the range between 1 and 500, for example between 1 and 200 and, such as between 1 and 100.

In other words, the facet main body 28 is divided into a plurality of hollow chambers $2_i^j$, wherein reflection chamber walls of the hollow chambers $29_i^j$ form different portions 27 of the reflection surface 27.

Part of the facet assembly 26 is also an actuator control apparatus 30, which is operatively connected to the hollow chambers $29_i^j$ for the controlled deformation of the reflection surface chamber walls of the reflection surface portions $27_i^j$. The actuator control apparatus is signal-connected to a plurality of actuator units $31_i^j$ in a manner that is not shown in the drawing. The actuator units $31_i^j$ are assigned in each case to the hollow chambers $29_i^j$ and/or to the reflection chamber walls of the reflection surface portions $27_i^j$.

Depending on the embodiment of the control, the actuator control apparatus 30 can be connected to the at least one reflection surface chamber wall of the reflection surface portion $27_i^j$ via the at least one actuator unit $31_i^j$. This connection can be effected via a mechanical connection, for example via a spring pre-loading, or via a piezo stack disposed in the respective hollow chamber $29_i^j$. By specifying the spring pre-loading, the deformation of the reflection surface chamber wall of the respective reflection surface portion $27_i^j$ can then take place.

At least one fine adjustment actuator unit 32 is furthermore part of the deformation control of the reflection surface 27. The former ensures an additional operative connection of the actuator control apparatus 30 to the reflection surface 27 either overall or to at least one of the reflection surface portions $27_i^j$. This operative connection can likewise be a mechanical connection for the fine adjustment deformation or can be a piezo actuator unit. In the latter case, the facet main body 28 carries, on the side of the reflection surface 27, a piezoactive coating or piezo coating 33, which can be actuated via the fine adjustment actuator unit 32. The piezoactive coating can likewise be present in the form of portions and can be assigned, in the form of coating portions $33_i^j$, to the reflection surface portions $27_i^j$. In this case, each of the portions $33_i^j$ of the piezoactive coating can be actuated via a dedicated fine adjustment actuator unit $32_i^j$.

Using the actuator units 31i, it is possible, for example, to bring about a typical deformation of the associated reflection surface portion via a travel in the range between 5 μm and 500 μm. Using the fine adjustment actuator units 32, an actuation travel in the range between 0.3 μm and 5 μm can be realized.

The at least one hollow chamber 29 can be filled with a medium. The medium can be a heat-conductive medium ensuring removal of heat, for example from residual absorption of the illumination light 3, from the reflection surface 27 to the facet main body 28 and, from there, possibly to a heat trap. A thermal conductivity of the medium 34 can be greater than 7 W/mK and can be at least 10 W/mK. The unit [W/mK] in this case means "watt/metre kelvin".

The at least one hollow chamber 29 can be filled with a fluid. Such a fluid can have a heat-removing effect, as described above.

In the case of the hollow chambers $29_i^j$ being filled with fluid, the actuator control apparatus 30 can, depending on the embodiment of the facet assembly 26, be operatively connected to the respective hollow chamber $29_i^j$ for changing a fluid pressure in the hollow chamber $29_i^j$ in a controlled manner. Such a pressure change can be effected hydraulically. A density variation via an electric field or a fluid pressure change via penetration of magnetic forces is also possible. As has already been explained above, the controlled pressure change can be effected via individual actuator units $33_i^j$ assigned to the reflection surface portions $27_i^j$.

A further embodiment of a facet assembly 35 that can be used instead of the facet assembly 26 will be described below with reference to FIG. 6. Components and functions corresponding to those which have already been explained above with reference to FIGS. 1 to 5, and particularly with reference to FIGS. 4 and 5, bear the same reference signs and will not be discussed in detail again.

Figure 6:
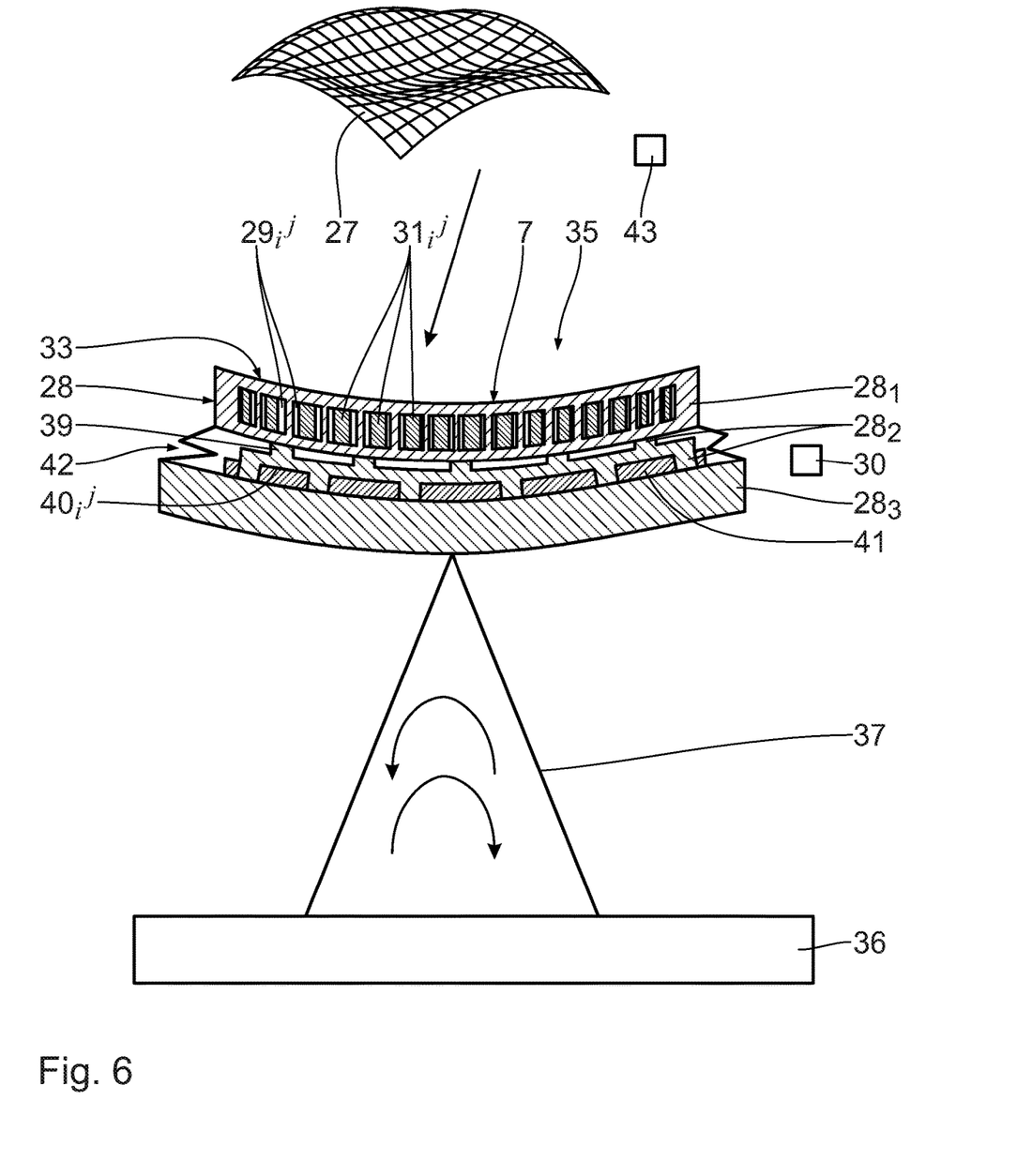
FIG. 6 shows a further embodiment of a facet assembly, likewise in a side view, wherein this illustration is more detailed compared to that in FIG. 5.

FIG. 6 clearly illustrates at the top a result of a deformation of the reflection surface 27 of the facet assembly 35 due to corresponding actuation by the actuator control apparatus 30. The deformation result is a freeform surface.

The facet assembly 35 is carried by a carrier plate 36 and a tilt bearing 37, via which a plurality of tilt positions of the field facet 7 of the field facet assembly 35 are specifiable for changing a deflecting effect of the reflection surface for the illumination light and for example for switching between different pupil facets that are assigned to the field facet of the facet assembly 35 via an illumination channel. The facet main body 28 is again divided into a plurality of hollow chambers $29_i^j$. Disposed in the hollow chambers $29_i^j$ are actuator units $31_i^j$ in the form of springs with a variable pre-loading force and/or in the form of piezo stacks, which bring about a targeted deformation of the reflection surface 27, as illustrated in FIG. 6 at the top, via a variable exertion of force on the respective reflection surface portion $27_i^j$. In addition, the reflection surface 27 has again a piezoelectric coating 33 for the purpose of fine adjustment of the deformation. The actuator units $31_i^j$ can be magnetostrictive or thermal actuators.

In the case of the facet assembly of FIG. 6, the facet main body 28 is divided into a plurality of layers that perform different functions. The main body layer $28_1$ illustrated in FIG. 6 at the top includes the hollow chambers $27_i^j$. Arranged under this topmost main body layer is a central main body layer $28_2$ having further actuator units 39, which may be piezo actuators, and having further hollow chambers $40_i^j$, which are filled with a heat-conductive medium 41. The bottommost layer of the facet main body 28 is a main body layer $28_3$, which is a heat sink or a heat trap for removing absorption heat from the main body layer $28_1$ via the main body layer $28_2$. A pre-deformation or tilt displacement of the upper main body layer $28_1$ relative to the lower main body layer $28_3$ is possible via the central main body layer $28_2$. The facet main body 28 is laterally terminated in the region of the central main body layer $28_2$ by a flexible membrane 42. The hollow chambers $29_i^j$ and 40 are produced in the facet main body 28 for example using an etching process. After electrical contacts, which can be used for actuator units in the interior of the chamber, are guided out, the hollow chambers can be closed for example by diffusion bonding.

To position the field facets 7 of the field facet mirror 6 of the illumination optical unit 25, the procedure is as follows:

First, the field facet mirror 6 with the field facets 7 and the pupil facet mirror 9 with the pupil facets 8 is provided. Next, an illumination setting is set, for example a conventional illumination setting with full illumination of all the pupil facets 8 of a central region of the pupil facet mirror 9, an annular illumination setting with illumination of a ring-shaped pupil facet arrangement on the pupil facet mirror 9, or a dipole, quadrupole or other multipole setting, wherein a corresponding number of regions of pupil facets 8 on the pupil facet mirror 9 are illuminated. Furthermore, this illumination setting is used to specify the associated assignment of the field facets 7 of the field facet mirror 6 and of the pupil facets 8 of the pupil facet mirror 9 to the illumination channels 10 according to the illumination setting. Next, the actuator units $31_i^j$ and possibly 32 and 39 are controlled via the actuator control apparatus 30 to specify reflection surface shapes of the reflection surfaces 27 of the acted-upon field facets 7 of the field facet mirror 6, adapted to the respective illumination channel assignment.

In general, the projection exposure apparatus 1 can also have a measurement apparatus for qualifying an optical effect of the deformation of the respective reflection surfaces 27 of the field facets 7 brought about via the actuator control apparatus 30. Such a measurement apparatus can check, for example, a quality of a generation of a light source image on the respective pupil facet 8. This is possible for example by way of image-generating capturing of an impingement of the pupil facets 8 with the illumination light 3. Such image-generating capturing can include a spatially resolving detector 43, for example in the form of a CCD detector. Such a detector 43 can be signal-connected to the actuator control apparatus 30. In this way, controlled deformation of the respective reflection surfaces 27 of the facet assemblies 26 and 35 can take place. The actuator control apparatus 30 in that case is an actuator open-loop/closed-loop control apparatus. The closed-loop measurement unit used can also be an apparatus for the interferometric measurement of a wavefront of the illumination light reflected by the reflection surface.

A measurement apparatus can be arranged in the region of the image plane, that is to say in the region of an arrangement plane of the wafer 24. A variant of such a measurement apparatus can be configured such that full illumination of a pupil of the illumination optical unit or of the projection optical unit is continuously captured thereby.

A variant of the measurement apparatus can be arranged in the object plane, that is to say in the region of the reticle 19.

To prepare the shaping of the respective facet reflection surface, the respective surface deformation for specified actuator setting combinations can be captured by measurement technology in dependence on the manipulated variables for the actuator units 31 and the fine adjustment actuator units 32 and a database for the system control can be generated in this way. Depending on the assignment of the field facets to respective pupil facets, it is possible to search a lookup table for assigned target reflection surface shapes of the field facets and, via setting of the manipulated variables, defined via the calibration, on the actuator units 31 and the fine adjustment actuator units 32, an actual reflection surface shape can then be made to coincide with the specified target reflection surface shape within specified tolerance limits. Such a calibration can be effected cyclically.

In order to produce a microstructured or nanostructured component, the projection exposure apparatus 1 is used as follows: First, the reflection mask 19 or the reticle and the substrate or the wafer 24 are provided. Subsequently, a structure on the reticle 19 is projected onto a light-sensitive layer of the wafer 24 with the aid of the projection exposure apparatus 1. Then, a microstructure or nanostructure on the wafer 24, and hence the microstructured component, is produced by developing the light-sensitive layer.

What is claimed is:

1. A facet assembly, comprising:
   a facet comprising a comprising a facet main body; and
   an actuator control apparatus,
   wherein:
   the facet main body comprises a plurality of hollow chambers;
   for each hollow chamber, a wall of the hollow chamber comprises a reflection surface configured to reflect illumination light;
   the actuator control apparatus is operatively connected to the hollow chambers for the controlled deformation of the reflection surfaces; and
   the facet comprises a reflective surface which comprises the reflective surfaces of the hollow chambers.

2. The facet assembly of claim 1, wherein the actuator control apparatus is signal-connected to a plurality of actuator units, and each actuator unit is assigned to a corresponding hollow chamber and/or a corresponding reflection surface.

3. The facet assembly of claim 1, wherein the reflection surfaces are arranged in exactly one row, in exactly one column, or in an array comprising at least two rows and at least two columns.

4. The facet assembly of claim 1, wherein the reflection surfaces are arranged in an array comprising at least two rows and at least columns, and a number of the reflection surfaces along one of the rows is different from a number of reflection surfaces along one of the columns.

5. The facet assembly of claim 1, wherein the actuator control apparatus is operatively connected to the hollow chambers via at least one additional fine adjustment actuator unit.

6. The facet assembly of claim 1, further comprising a medium disposed in a hollow chamber, wherein the medium is configured to remove heat from the reflection surface of the hollow chamber containing the medium.

7. The facet assembly of claim 6, wherein the medium comprises a liquid.

8. The facet assembly of claim 6, wherein the medium comprises at least one member selected from the group consisting of a liquid metal, a heat-conducting paste, a ceramic dispersion, a powder, and a granular material.

9. The facet assembly of claim 8, wherein the actuator control apparatus is operatively connected to the hollow chamber comprising the medium to change a fluid pressure in the hollow chamber.

10. The facet mirror of claim 8, wherein at least some of the facets of the facet assembly are tiltable between a plurality of tilt positions to change a deflecting effect for the illumination light.

11. The facet assembly of claim 6, wherein the actuator control apparatus is operatively connected to the hollow chamber comprising the medium to change a fluid pressure in the hollow chamber.

12. The facet assembly of claim 6, wherein the medium comprises at least one member selected from the group consisting of a liquid metal, a heat-conducting paste, a ceramic dispersion, a powder, and a granular material.

13. The facet assembly of claim 1, further comprising a medium in a hollow chamber, wherein the actuator control apparatus is operatively connected to the hollow chamber comprising the medium to change a fluid pressure in the hollow chamber.

14. A facet mirror, comprising:
the facet assembly of claim 1.

15. An illumination optical unit, comprising:
a facet mirror comprising the facet assembly of claim 1, the facet mirror configured to guide illumination light partial beams along an illumination light beam path into an object field; and
a transfer optical unit configured to image the facets of the facet mirror into the object field with superposition.

16. The illumination optical unit of claim 15, further comprising a light source configured to generate the illumination light.

17. An optical system, comprising:
an illumination optical unit, comprising:
a facet mirror comprising the facet assembly of claim 1, the facet mirror configured to guide illumination light partial beams along an illumination light beam path into an object field; and
a transfer optical unit configured to image the facets of the facet mirror into the object field with superposition; and
a projection optical unit configured to image the object field into an image field.

18. The optical unit system of claim 17, further comprising a light source configured to generate the illumination light.

19. A projection exposure apparatus, comprising:
an illumination optical unit, comprising:
a facet mirror comprising the facet assembly of claim 1, the facet mirror configured to guide illumination light partial beams along an illumination light beam path into an object field; and
a transfer optical unit configured to image the facets of the facet mirror into the object field with superposition;
a projection optical unit configured to image the object field into an image field; and
a light source configured to generate the illumination light.

20. A method of using a projection optical unit comprising an illumination optical unit and a projection optical unit, the method comprising:
using the illumination optical unit to illuminate an object in an object plane; and
using the projection optical unit to image the illuminated object into an image plane,
wherein the illumination optical unit comprises a facet mirror comprising the facet assembly of claim 1.

21. The facet assembly of claim 1, further comprising:
a plurality of additional facets,
wherein, for each additional facet:
the facet comprises a facet main body;
the facet main body comprises a plurality of hollow chambers;
for each hollow chamber, a wall of the hollow chamber comprises a reflection surface configured to reflect illumination light;
the actuator control apparatus is operatively connected to the hollow chambers for the controlled deformation of the reflection surfaces; and
the facet comprises a reflective surface which comprises the reflective surfaces of the hollow chambers.

* * * * *